United States Patent [19]
Chien et al.

[11] Patent Number: 5,981,334
[45] Date of Patent: Nov. 9, 1999

[54] METHOD OF FABRICATING DRAM CAPACITOR

[76] Inventors: Sun-Chieh Chien, No. 7, Lane 30, Tunfeng Rd., Shiang-Shan Ward, Hsinchu City; Jason Jenq, No. 68-1, Park W. Rd, Pingtung City; C. C. Hsue, No. 13, Lane 112, Ke Hsueh Yuan Rd., Hsinchu City, all of Taiwan

[21] Appl. No.: 08/965,326

[22] Filed: Nov. 6, 1997

[30] Foreign Application Priority Data

Aug. 21, 1997 [TW] Taiwan .................................. 86111977

[51] Int. Cl.⁶ ............................ H01L 21/70; H01L 21/00
[52] U.S. Cl. ......................... 438/253; 438/253; 438/254; 438/255; 438/256; 438/396; 438/397; 438/398; 438/399
[58] Field of Search .................................. 438/253, 254, 438/255, 256, 396, 397, 398, 399

[56] References Cited

U.S. PATENT DOCUMENTS

| | | | |
|---|---|---|---|
| 5,126,916 | 6/1992 | Tseng ........................................ 361/313 |
| 5,185,282 | 2/1993 | Lee et al. ................................... 437/47 |
| 5,363,666 | 11/1994 | Dennison ................................... 437/52 |
| 5,413,950 | 5/1995 | Chen et al. ................................ 437/52 |
| 5,429,980 | 7/1995 | Yang et al. ................................ 437/52 |
| 5,457,065 | 10/1995 | Huang et al. .............................. 437/60 |
| 5,464,782 | 11/1995 | Koh ........................................... 437/41 |
| 5,554,557 | 9/1996 | Koh ........................................... 437/52 |
| 5,567,640 | 10/1996 | Tseng ........................................ 437/52 |
| 5,597,755 | 1/1997 | Ajika et al. ................................ 437/52 |
| 5,607,874 | 3/1997 | Wang et al. ............................... 437/52 |
| 5,648,291 | 7/1997 | Sung ......................................... 437/52 |
| 5,652,172 | 7/1997 | Yung-Sung ................................ 437/60 |

*Primary Examiner*—Robert Kunemund
*Assistant Examiner*—Matt Anderson

[57] ABSTRACT

A method for fabricating DRAM capacitor which includes forming a transistor having a source/drain regions and a gate electrode above a silicon substrate; then, forming sequentially a stack of layers including a first insulating layer, a second insulating layer, a third insulating layer and a hard mask layer over the transistor; subsequently, patterning and etching the hard mask layer. Thereafter, an oxide layer is formed over the hard mask layer, and then portions of the layers are etched to form a capacitor region over the oxide layer and a contact opening exposing a portion of the source/drain region. In the subsequent step, a conducting layer is formed over the oxide layer, the hard mask layer, the sidewalls of the contact opening and the exposed portion of the source/drain region. Next, a polishing method is used to remove the conducting layer above the oxide layer, and then the oxide layer is removed to form a lower electrode. A dielectric layer is then formed over the lower electrode, and finally an upper electrode layer is formed over the dielectric layer.

19 Claims, 7 Drawing Sheets

METHOD OF FABRICATING DRAM CAPACITOR

BACKGROUND OF THE INVENTION

1. Field of Invention

The present invention relates to a method for fabricating a semiconductor device. More particularly, the present invention relates to a dynamic random access memory (DRAM) capacitor structure and its method of fabrication.

2. Description of Related Art

DRAM is now extensively used in all kinds of integrated circuit devices, and has become an indispensable element to the electronic industries in this information age. FIG. 1 is the circuit diagram of a memory cell or memory unit of a DRAM device. As shown in FIG. 1, the memory cell comprises a pass transistor T and a storage capacitor C. The source terminal of the pass transistor T is connected to a bit line (BL), the drain terminal is connected to a storage electrode 6 of the storage capacitor C, the gate terminal is connected to a word line (WL) and the opposed electrode 8 of the storage capacitor C is connected to a fixed voltage source. Between the storage electrode 6 and the opposed electrode 8, there is a dielectric layer 7. Those who are familiar with the art of semiconductor manufacture may know, the capacitor C is used for storing up digital data, and therefore must have a sufficiently large capacitance to avoid rapid data lost.

In the fabrication of conventional DRAMs having a memory capacity of 1 MB or less, a two dimensional capacitor device, generally known as the planar-type capacitor, is often employed for the storage of digital data. FIG. 2 is a cross-sectional view of a conventional planar-type DRAM capacitor. As shown in FIG. 2, a silicon substrate 10 is first provided. Then, a field oxide layer 11 is formed on the substrate 10 to define the active regions. Next, a gate oxide layer 12, a gate layer 13 and source/drain regions 14 are sequentially formed on the substrate 10 constituting a pass transistor T. In a subsequent step, a dielectric layer 7 and a conducting layer 8 are sequentially formed over portions of the substrate neighboring the drain terminal. The region 6 where the dielectric layer 7 and the conducting layer 8 overlap the substrate 10 forms a storage capacitor C. Quite obvious from the above planar-type capacitor structure, a relatively large surface area is required to form a storage capacitor C that has sufficient capacitance. Hence, this design is unable to meet the demand of ever increasing level of integration for DRAM devices.

In general, highly integrate DRAMs, for example, those bigger than about 4 MB memory capacity, requires three dimensional capacitor structures such as the stack-type or the trench-type structure for the capacitor devices.

FIG. 3 is a cross-sectional view of a conventional stack-type capacitor structure. As shown in FIG. 3, a field oxide layer 11, a gate oxide layer 12, a gate layer 13 and source/drain regions 14 are sequentially formed above a substrate 10 constituting a pass transistor T. Thereafter, an insulating layer 15 is formed over the substrate 10, then a contact opening 14 is etched out exposing portions of a source/drain region 14. Subsequently, a polysilicon layer 6 (functioning as the storage electrode), a dielectric layer 7 and a conducting layer 8 (functioning as the opposed electrode) are sequentially formed over the contact opening, thus establishing a stack-type DRAM capacitor memory cell. The above stack-type capacitor structure is capable of supplying sufficiently large amount of capacitance with relatively good device integrity. However, for higher level of integration, such as in a 64 MB or bigger storage capacity DRAM, even a simple stack-type capacitor structure is insufficient.

On the other hand, another means of increasing the capacitance is to produce a trench-type capacitor. FIG. 4 is a cross-sectional views of a conventional trench-type capacitor structure. As shown in FIG. 4, processes very similar to the fabrication of a stack-type capacitor are first performed forming a pass transistor T over a silicon substrate 10. The pass transistor T includes a gate oxide layer 12, a gate layer 13 and a source/drain regions 14. Thereafter, a deep trench is formed by etching the substrate 10 neighboring a drain terminal 14, and then a storage capacitor C is formed inside the trench region. The storage capacitor C is formed on the sidewalls of the trench and comprises a storage electrode 6, a dielectric layer 7 and a polysilicon opposed electrode 8. The above trench-type capacitor is also capable of increasing the surface area of the electrode and hence increasing capacitance. However, etching the substrate 10 to form a trench may cause some damages to the crystal lattice, and leakage current may increase as a result, thereby affecting the operational characteristics of the device. In addition, as the aspect ratio of the trench is increased, the etching rate will correspondingly be reduced, and therefore, fabrication becomes more difficult and productivity is certain to be affected.

In light of the foregoing, there is a need in the art for increasing the capacitance in a DRAM capacitor.

SUMMARY OF THE INVENTION

Accordingly, the present invention is directed to provide a DRAM capacitor that is capable of maintaining sufficient capacitance despite the ever-shrinking planar surface area available for the placement of a device due to miniaturization.

To achieve these and other advantages and in accordance with the purpose of the invention, as embodied and broadly described herein, the invention includes the steps of forming a DRAM capacitor by first forming a transistor having a source/drain regions and a gate electrode above a silicon substrate; then, forming sequentially a stack of layers including a first insulating layer, a second insulating layer, a third insulating layer and a hard mask layer over the transistor; subsequently, patterning and etching the hard mask layer. Thereafter, an oxide layer is formed over the hard mask layer, and then portions of the oxide layer, the third insulating layer, the second insulating layer and the first insulating layer are etched to form a contact opening exposing a portion of the source/drain region. In the subsequent step, a conducting layer is formed over the oxide layer, the hard mask layer, the sidewalls of the contact opening and the exposed portion of the source/drain region. Next, a polishing method is used to remove the conducting layer above the oxide layer, and then the oxide layer is removed by etching to form a lower electrode. A dielectric layer is then formed over the lower electrode, and finally an upper electrode layer is formed over the dielectric layer thus completing the fabrication of the capacitor.

The first characteristic of this invention is that by polishing away the conducting layer above the oxide layer followed by the etch removal of the oxide layer, the surface area of the capacitor is increased, and hence its capacitance is also increased.

The second characteristic of this invention is the application of a Damascene process in forming the lower electrode of the capacitor.

The third characteristic of this invention is that there is no height difference between the capacitors.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
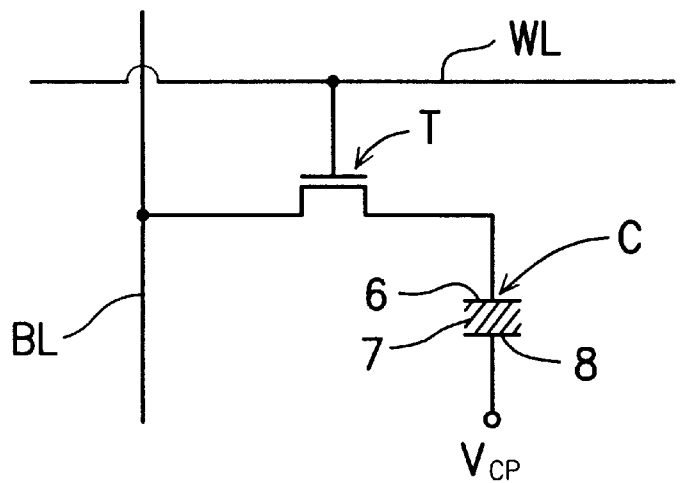
FIG. 1 is the circuit diagram of a memory cell of a DRAM device.
Figure 2:
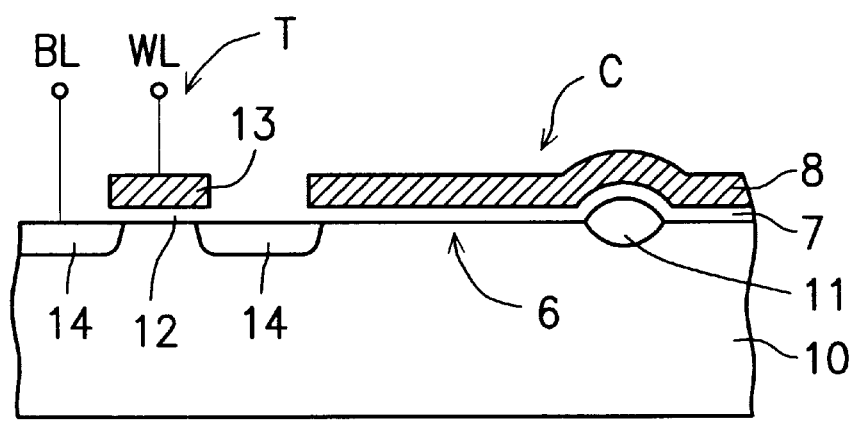
FIG. 2 is a cross-sectional view of a conventional planar-type DRAM capacitor.
Figure 3:
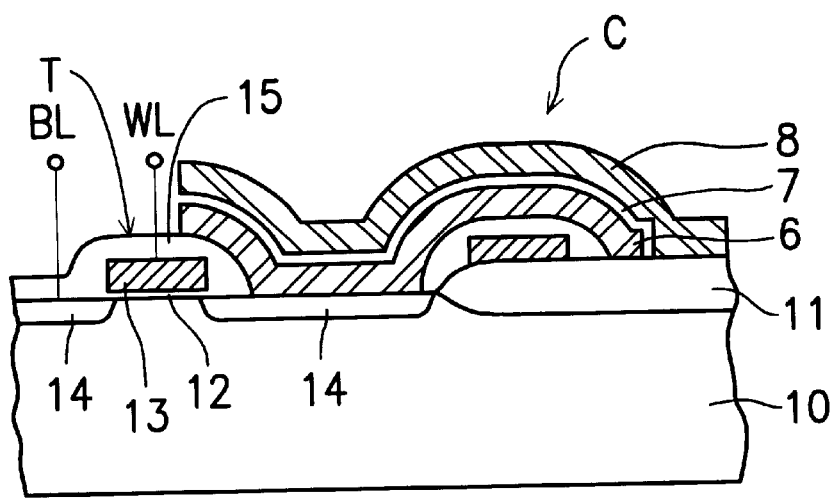
FIG. 3 is a cross-sectional view of a conventional stack-type capacitor structure.
Figure 4:
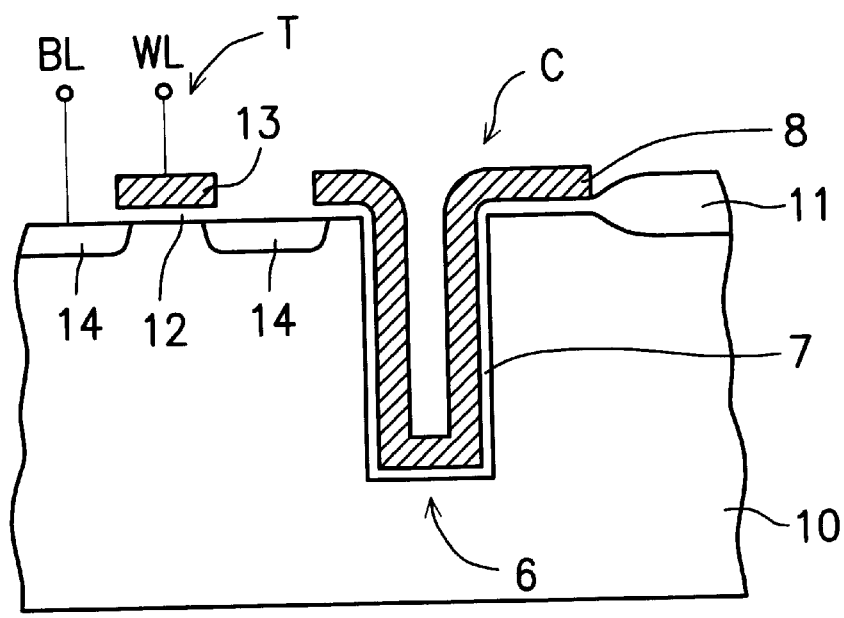
FIG. 4 is a cross-sectional views of a conventional trench-type capacitor structure.

Reference will now be made in detail to the present preferred embodiments of the invention, examples of which are illustrated in the accompanying drawings. Wherever possible, the same reference numbers are used in the drawings and the description to refer to the same or like parts.

Figure 5A:
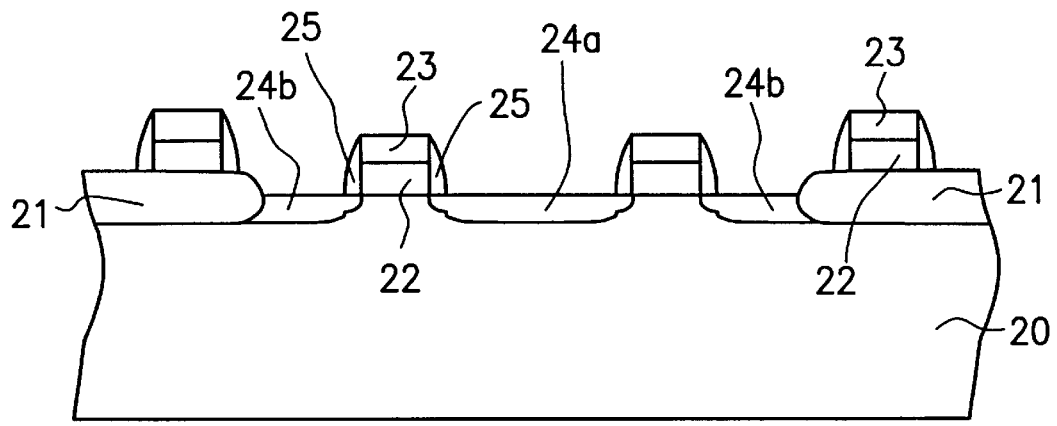
FIGS. 5A through 5F are cross-sectional views showing the progression of manufacturing steps for forming a DRAM capacitor according to a first preferred embodiment of this invention.

FIGS. 5A through 5F are cross-sectional views showing the progression of manufacturing steps for forming a DRAM capacitor according to the first preferred embodiment of this invention. First, as shown in FIG. 5A, field oxide layers 21 are formed in a silicon substrate 20 for defining the boundaries of an active region. Then, a gate electrode, spacers 25, source/drain terminal regions 24a and 24b are sequentially formed above the active region constituting a transistor. The gate electrode includes a tungsten silicide layer 22 and a first polysilicon layer 23.

Figure 5B:
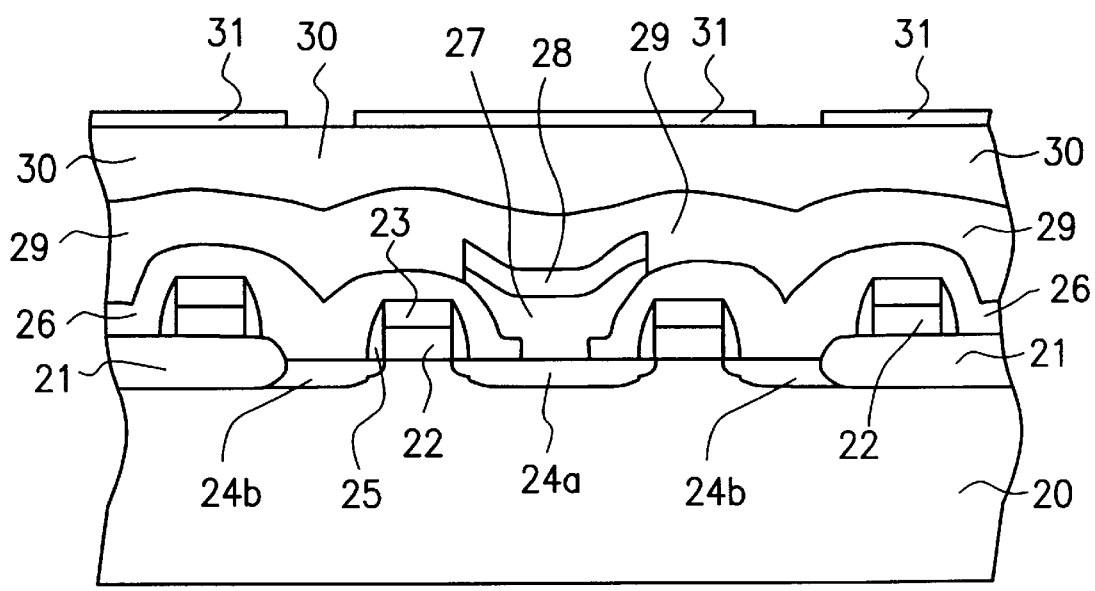

Next, as shown in FIG. 5B, a first insulating layer 26 is formed over the gate electrode and the source/drain terminal regions 24a and 24b. The first insulating layer 26 can be formed, for example, by depositing tetraethyl orthosilicate (TEOS) to a thickness of about 1500 angstroms using a low pressure chemical vapor deposition (LPCVD) method. Subsequently, microlithographic and etching processes are used to form a contact opening in the first insulating layer 26 exposing portions of the source/drain region 24a. Next, a polysilicon layer is deposited into the contact opening over the exposed portions of the source/drain region 24a, and then impurities are implanted into the polysilicon layer. In a subsequent step, tungsten silicide (WSi2) is deposited over the polysilicon layer. Then, microlithographic and etching processes are again used to define the polysilicon layer and the tungsten silicide layer to form a polysilicon layer 27 and a tungsten silicide layer 28. Thereafter, a second insulating layer 29 is formed over the first insulating layer 26 and the tungsten silicide layer 28. The second insulating layer 29 can be formed, for example, by depositing an oxide layer to a thickness of about 1500 angstroms using an atmospheric pressure chemical vapor deposition (APCVD) method. Subsequently, a borophosphosilicate glass (BPSG) layer or a BPTEOS layer having a thickness of about 7500 angstroms to 10000 angstroms is formed by performing a heat reflow operation at a temperature of about 850° C. Then, a layer of BPSG or BPTEOS having a thickness of about 4500 angstroms to 7000 angstroms is removed by etching back to form a third insulating layer 30. Thereafter, a silicon nitride layer (SiN) having a thickness of about 500 angstroms to 1000 angstroms is deposited over the third insulating layer 30. Then, again using microlithographic and etching processes, a hard mask layer 31 functioning as an etch protection layer is formed.

Figure 5C:
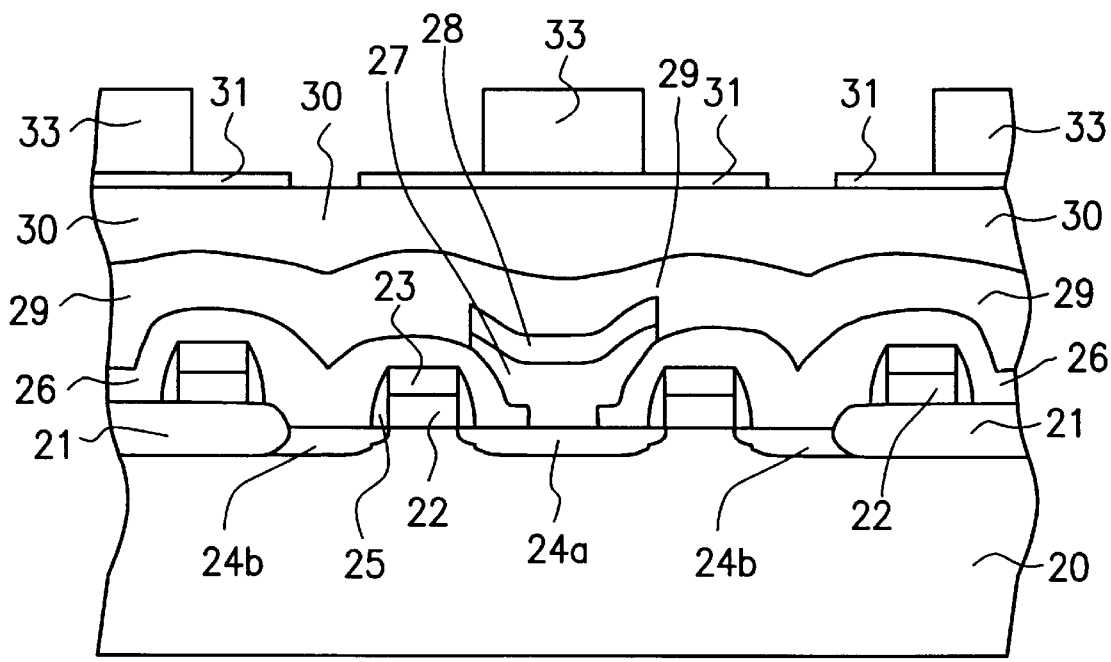

Next, as shown in FIG. 5C, an oxide layer having a thickness of about 5000 angstroms to 8000 angstroms is deposited over the hard mask layer 31, and then the oxide layer is patterned and etched to form an oxide layer 33 defining a capacitor region.

Figure 5D:
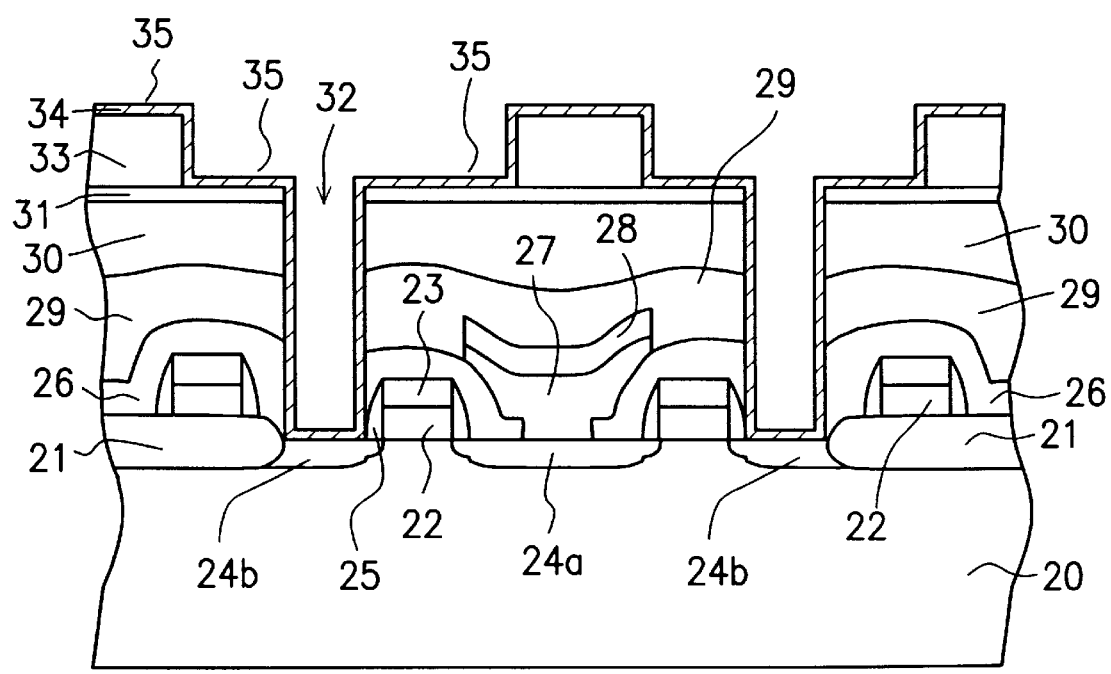

Next, as shown in FIG. 5D, a photoresist layer (not shown in the FIG.) is coated over the oxide layer 33. In a subsequent step, using the hard mask layer 31 as a mask, portions of the third insulating layer 30, the second insulating layer 29 and the first insulating layer 26 are etched to form contact opening 32 exposing portions of the source/drain region 24b. Thereafter, a conducting layer 34 having a thickness of about 200 angstroms to 1000 angstroms is deposited over the exposed oxide layer 33, the hard mask layer 31, the sidewalls of the contact opening 32 and the source/drain region 24b to form a lower electrode of the capacitor. The conducting layer 34 can be, for example, an impurity doped polysilicon layer. In the present invention, a Damascene process is employed to form the lower electrode of the capacitor. The conducting layer 34 includes a first vertical trunk lining the sidewalls of the contact opening 32 and is connected at the bottom source/drain region 24b; a second vertical trunk above the hard mask layer 31; and a horizontal plate running almost parallel on the hard mask layer 31 surface. The first trunk and the second trunk stand vertically with respect to the substrate surface 20, and two ends of the horizontal plate is connected to the first trunk and the second trunk, respectively. The first trunk is located below the horizontal plate, while the second trunk is located above the horizontal plate.

Figure 5E:
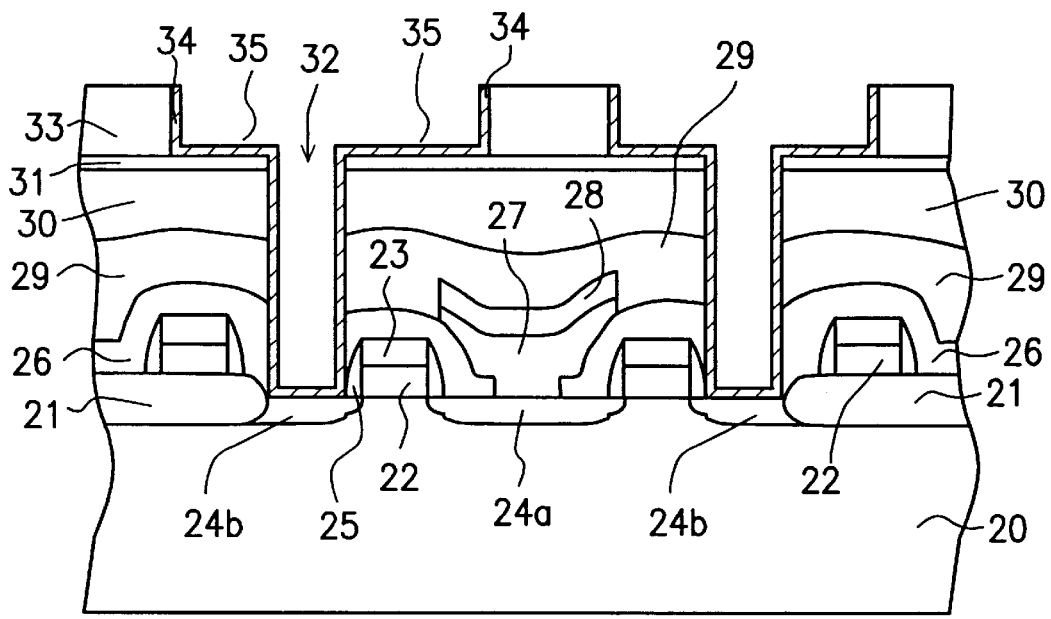

Next, as shown in FIG. 5E, a chemical mechanical polishing (CMP) method is used to remove the conducting layer 34 above the oxide layer 33.

Figure 5F:
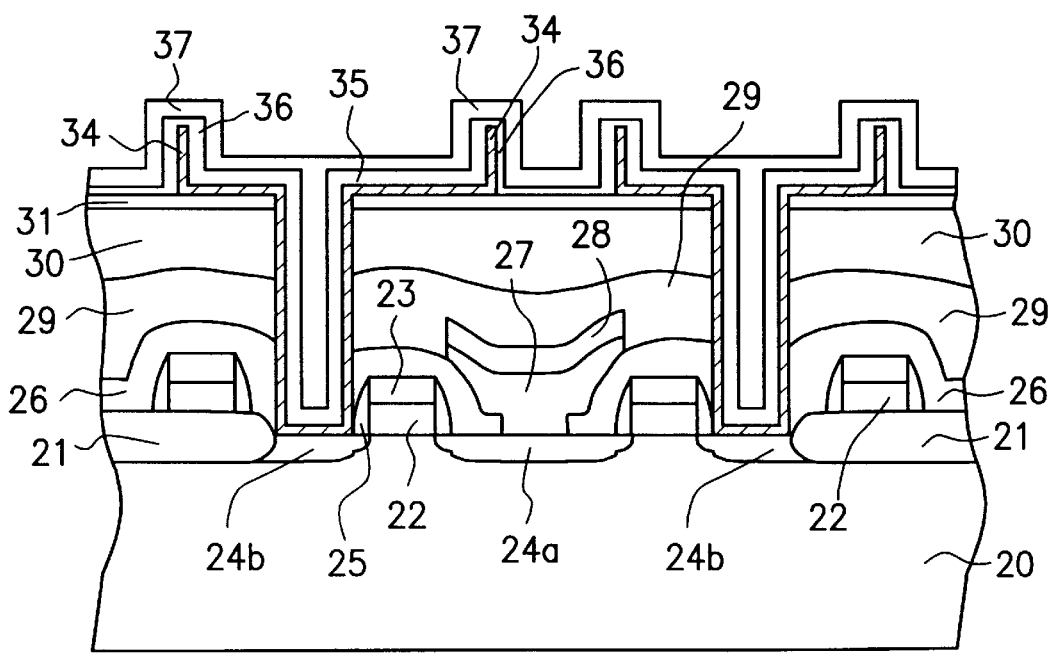

Thereafter, as shown in FIG. 5F, a wet etching method is used to remove the oxide layer 33 exposing the other side of the second vertical trunk for increasing the surface area of the lower electrode. The wet etching method can use, for example, a buffered oxide etchant (BOE). Subsequently, a dielectric layer 36 is deposited over the lower electrode. The dielectric layer 36 can be, for example, an oxide/nitride/oxide (ONO) three-layered composite structure, of a nitride/oxide (NO) two-layered composite structure, or tantalum pentoxide ($Ta_2O_5$). If the dielectric layer 36 is a tantalum pentoxide layer, preferably the conducting layer 34 is either an impurity doped polysilicon layer or a sequentially stacked titanium/titanium nitride composite layer. The titanium/titanium nitride composite layer can be formed by sputtering sequentially titanium and then titanium nitride over the exposed portions of the oxide layer 33, the hard mask layer 31, the sidewalls of the contact opening 32 and the source/drain region 24b.

Finally, as shown in FIG. 5F, an impurity doped polysilicon layer 37 is deposited over the dielectric layer 36 to form an upper electrode. If the dielectric layer 36 is a tantalum pentoxide layer, preferably the upper electrode is a titanium nitride layer formed by using a low pressure chemical vapor deposition (LPCVD) method. Subsequently, the remaining processes for the complete formation of the DRAM capacitor is carried out.

Figure 6A:
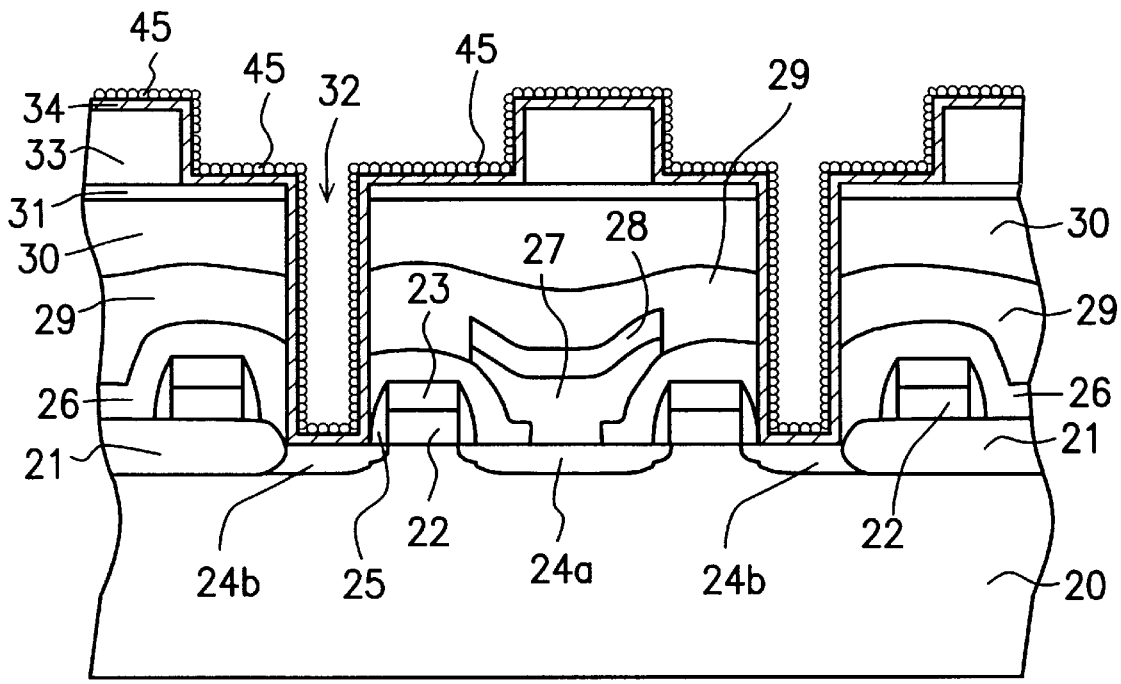
FIGS. 6A through 6C are cross-sectional views showing the progression of manufacturing steps for forming a DRAM capacitor according to a second preferred embodiment of this invention.
Figure 6B:
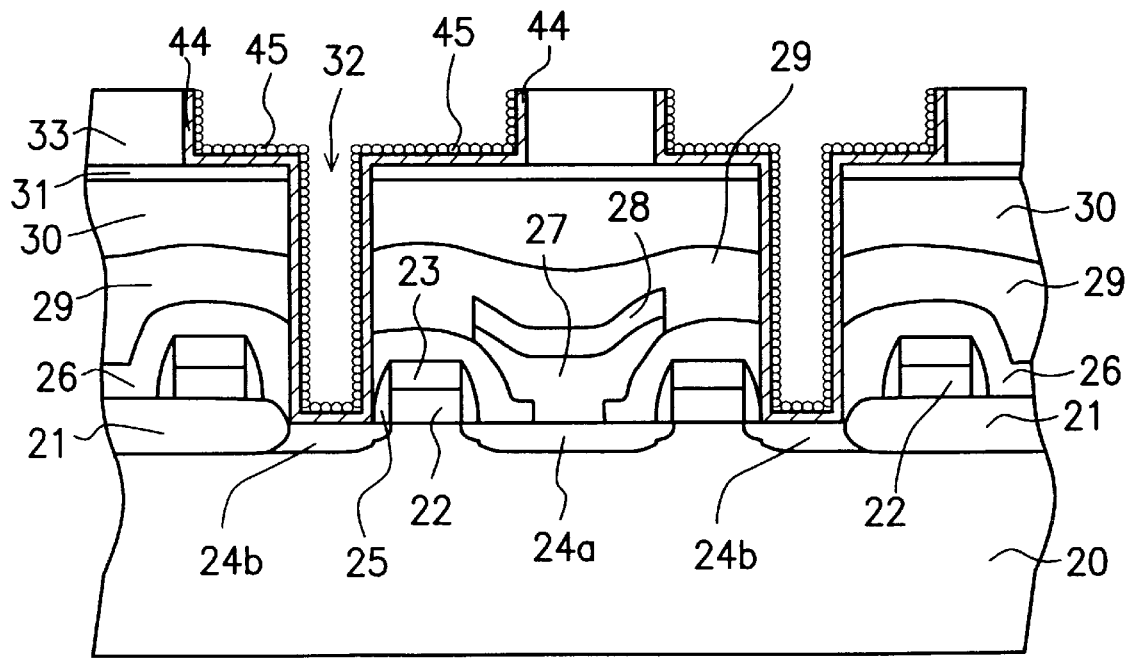
Figure 6C:
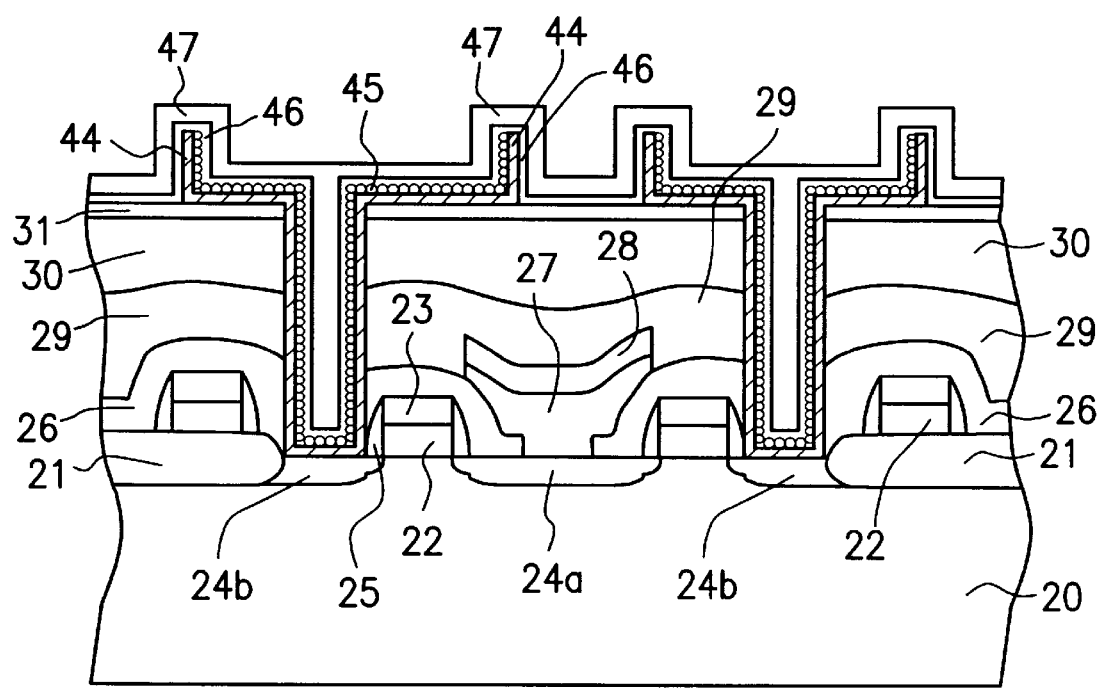

FIGS. 6A through 6C are cross-sectional views showing the progression of manufacturing steps for forming a DRAM capacitor according to a second preferred embodiment of this invention. In the second preferred embodiment, fabricating steps as shown in FIG. 5A through 5C are first carried out. As shown in FIG. 6A, an oxide layer having a thickness of about 5000 angstroms is deposited over the hard mask layer 31. Subsequently, the oxide layer is patterned and etched to form an oxide layer 33. A photoresist layer (not shown in the FIG.) is then coated over the oxide layer 33, and using the hard mask layer 31 as a mask, portions of the third insulating layer 30, the second insulating layer 29 and the first insulating layer 26 are etched to form a contact opening 32 exposing portions of the source/drain region 24b. Thereafter, a conducting layer 34 having a thickness of about 200 angstroms to 1000 angstroms is deposited over the exposed oxide layer 33, the hard mask layer 31, the sidewalls of the contact opening 32 and the source/drain region 24b. The conducting layer 34 can be, for example, an impurity doped polysilicon layer. The conducting layer 34 includes a first vertical trunk lining the sidewalls of the contact opening 32 and is connected at the bottom source/drain region 24b; a second vertical trunk above the hard mask layer 31; and a horizontal plate running almost parallel on the hard mask layer 31 surface.

As shown in FIG. 6A, hemispherical grain silicon (HSG) is then deposited on the surface of the conducting layer to form a layer 45, and together with the conducting layer 34 form the lower electrode of the capacitor. In the present invention, a Damascene process is employed to form the lower electrode of the capacitor. The hemispherical grain silicon layer 45 serves to increase the surface area of the lower electrode. The first trunk and the second trunk stand vertically with respect to the substrate surface 20, and two ends of the horizontal plate is connected to the first trunk and the second trunk, respectively. The first trunk is located below the horizontal plate, and the second trunk is located above the horizontal plate.

Next, as shown in FIG. 6B, a chemical mechanical polishing (CMP) method is used to remove the conducting layer 34 the hemispherical silicon grain layer 45 above the oxide layer 33.

Thereafter, as shown in FIG. 6C, a wet etching method is used to remove the oxide layer 33 exposing the other side of the second vertical trunk for increasing the surface area of the lower electrode. The wet etching method can use, for example, a buffered oxide etchant (BOE). Subsequently, a dielectric layer 46 is deposited over the lower electrode. The dielectric layer 46 can be, for example, an oxide/nitride/oxide (ONO) three-layered composite structure, of a nitride/oxide (NO) two-layered composite structure, or tantalum pentoxide ($Ta_2O_5$). If the dielectric layer 46 is a tantalum pentoxide layer, preferably the conducting layer 44 is either a impurity doped polysilicon layer or a sequentially stacked titanium/titanium nitride composite layer. The the titanium/titanium nitride composite layer can be formed by sputtering sequentially titanium and then titanium nitride over the exposed portions of the oxide layer 33, the hard mask layer 31, the sidewalls of the contact opening 32 and the source/drain region 24b.

Finally, as shown in FIG. 6C, an impurity doped polysilicon layer 47 is deposited over the dielectric layer 46 to form an upper electrode. If the dielectric layer 46 is a tantalum pentoxide layer, preferably the upper electrode is a titanium nitride layer formed by using a low pressure chemical vapor deposition (LPCVD) method. Subsequently, the remaining processes for the complete formation of the DRAM capacitor is carried out.

The first characteristic of this invention is that by polishing away the conducting layer above the oxide layer followed by the etch removal of the oxide layer, the surface area of the capacitor is increased, and hence its capacitance is also increased.

The second characteristic of this invention is the application of a Damascene process in forming the lower electrode of the capacitor.

The third characteristic of this invention is that there is no height difference between the capacitors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a DRAM capacitor comprising the steps of:

forming a transistor above a silicon substrate, wherein the transistor includes source/drain regions and a gate electrode;

forming a stack of a first insulating layer, a second insulating layer, a third insulating layer and a hard mask layer over the transistor;

patterning and etching the hard mask layer to expose portions of the third insulating layer;

forming an oxide layer over the hard mask layer;

patterning and etching away portions of the first insulating layer, the second insulating layer, the third insulating layer to form a contact opening exposing portions of the source/drain region;

forming a conducting layer over the oxide layer, the hard mask layer, the sidewalls of the contact opening and the exposed portions of the source/drain region;

removing the conducting layer above the oxide layer using a polishing method;

removing the oxide layer to form the lower electrode of the capacitor;

forming a dielectric layer over the lower electrode; and forming an upper electrode over the dielectric layer.

2. The method of claim 1, wherein the step of forming the first insulating layer includes depositing TEOS oxide using a low pressure chemical vapor deposition method.

3. The method of claim 1, wherein the step of forming the third insulating layer includes the substeps of depositing BPSG or BPTEOS having a thickness of about 7500 angstroms to 10000 angstroms;

heating to a temperature of about 850° C. causing the insulating layer to reflow; and etching back a layer having thickness of about 4500 angstroms to 7000 angstroms.

4. The method of claim 1, wherein the step of forming the oxide layer includes depositing oxide using a plasma chemical vapor deposition method.

5. The method of claim 1, wherein after the step of forming the conductive layer, further includes the step of depositing a hemispherical grain silicon over the conductive layer.

6. The method of claim 1, wherein the step of removing the conductive layer includes using a chemical-mechanical polishing method.

7. The method of claim 5, wherein the step of removing the conductive layer further includes removing of the conductive layer and the hemispherical grain silicon layer above the oxide layer using a polishing method.

8. The method of claim 1, wherein the step of removing the oxide layer includes coating a protective photoresist layer over the the capacitor region first and then using a wet etching method to remove the oxide layer.

9. The method of claim 1, wherein the conducting layer has a thickness of about 200 angstroms to 1000 angstroms.

10. The method of claim 1, wherein the first insulating layer has a thickness of about 1500 angstroms.

11. The method of claim 1, wherein the hard mask layer has a thickness of about 500 angstroms to 1000 angstroms.

12. The method of claim 1, wherein the step of forming the first insulating layer includes depositing TEOS oxide.

13. The method of claim 1, wherein the step of forming the hard mask layer includes depositing silicon nitride.

14. The method of claim 1, wherein the step of forming the conductive layer includes depositing impurity doped polysilicon.

15. The method of claim 1, wherein the step of forming the conductive layer includes the steps of first depositing titanium and then depositing titanium nitride.

16. The method of claim 14, wherein the step of forming the dielectric layer includes the steps of depositing sequentially silicon oxide, silicon nitride and silicon oxide.

17. The method of claim 14, wherein the step of forming the upper electrode includes depositing ion doped polysilicon.

18. The method of claim 15, wherein the step of forming the dielectric layer includes depositing tantalum pentoxide.

19. The method of claim 15, wherein the step of forming the upper electrode includes depositing titanium nitride.

* * * * *